(12) United States Patent
Ketchen et al.

(10) Patent No.: US 6,545,333 B1
(45) Date of Patent: Apr. 8, 2003

(54) LIGHT CONTROLLED SILICON ON INSULATOR DEVICE

(75) Inventors: Mark B. Ketchen, Hadley, MA (US); Edward J. Nowak, Essex Junction, VT (US); Jed H. Rankin, S. Burlington, VT (US); Keith C. Stevens, Fairfield, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/681,541

(22) Filed: Apr. 25, 2001

(51) Int. Cl.⁷ .............................................. H01L 31/06
(52) U.S. Cl. .................. 257/461; 257/79; 257/80; 257/83; 257/84; 257/460; 257/463; 257/347; 438/22; 438/24; 438/31; 438/48; 438/65
(58) Field of Search .............................. 257/79, 80, 83, 257/84, 460, 461, 463, 347; 438/31, 22, 24, 48, 65

(56) References Cited

U.S. PATENT DOCUMENTS

| 4,841,349 A | | 6/1989 | Nakano | |
|---|---|---|---|---|
| 5,130,773 A | * | 7/1992 | Tsukada | 357/23.7 |
| 5,389,776 A | | 2/1995 | Woodward | |
| 5,565,693 A | * | 10/1996 | Sasaki et al. | 257/94 |
| 6,020,581 A | | 2/2000 | Dennard et al. | |
| 6,090,636 A | * | 7/2000 | Geusic et al. | 438/31 |
| 6,316,281 B1 | * | 11/2001 | Lee et al. | 438/31 |
| 6,346,717 B1 | * | 2/2002 | Kawata | 257/72 |
| 6,429,487 B1 | * | 8/2002 | Kunikiyo | 257/354 |
| 6,433,362 B1 | * | 8/2002 | Pollard | 257/59 |

FOREIGN PATENT DOCUMENTS

| JP | 63-038269 | * | 2/1998 | 257/461 |
|---|---|---|---|---|

* cited by examiner

Primary Examiner—Eddie Lee
Assistant Examiner—Edgardo Ortiz
(74) Attorney, Agent, or Firm—Schmeiser, Olsen & Watts; Richard A. Henkler

(57) ABSTRACT

A device with an optically controlled VT is disclosed. The device includes a semiconductor die which includes an FET, the FET having a gate on an upper surface of a substrate, a body under the gate and a source contacting the body forming a body-to-source junction. A light source is provided for exposing the body to light from the lower surface of the substrate.

22 Claims, 14 Drawing Sheets

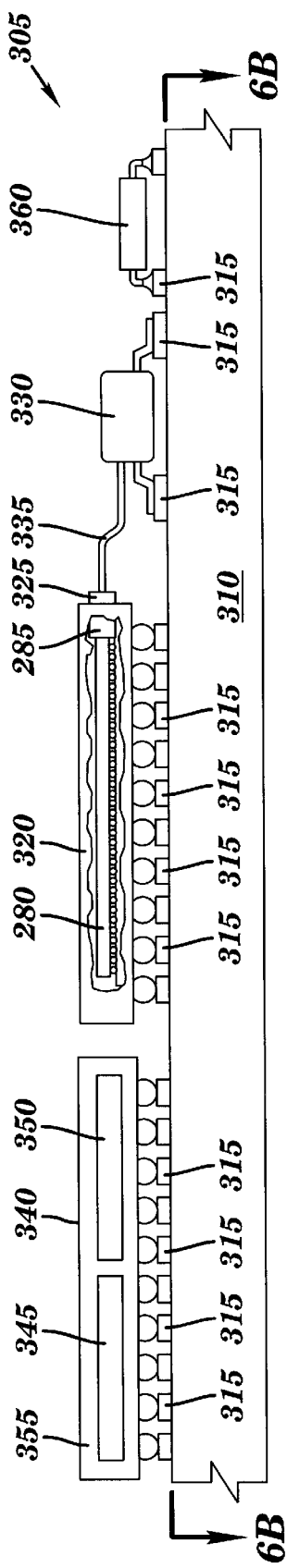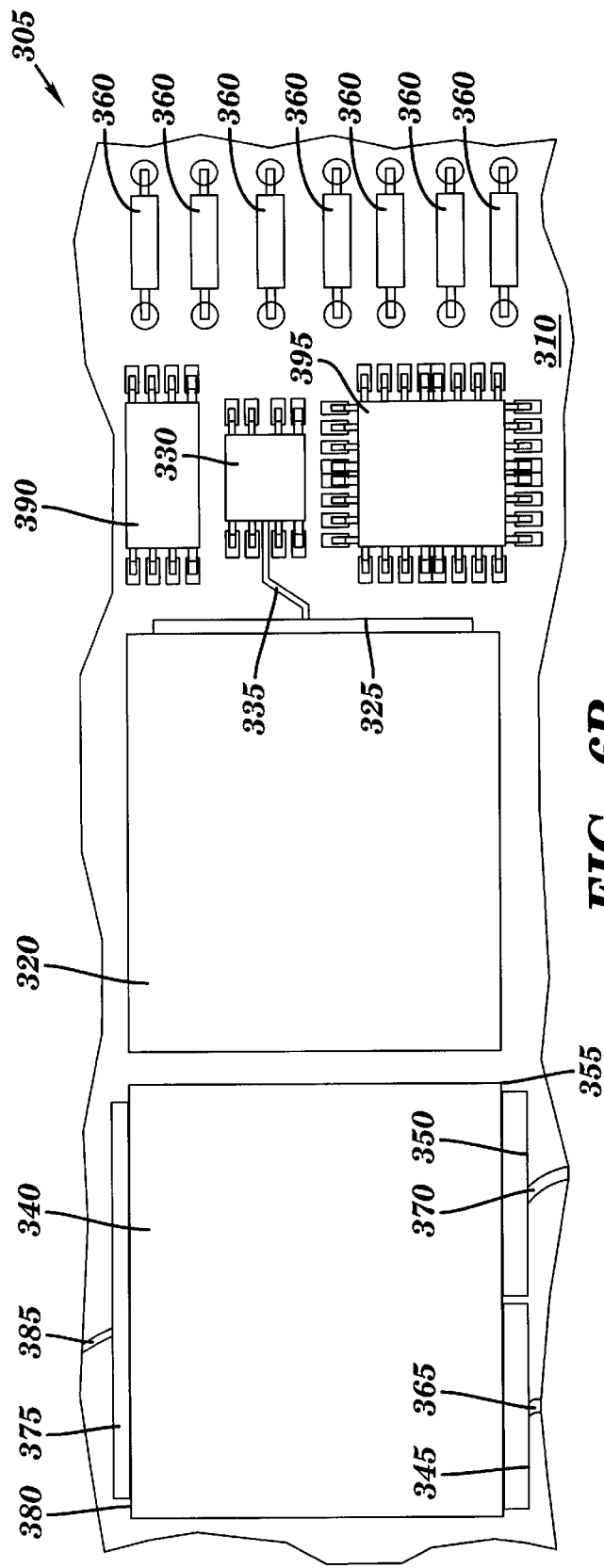
FIG. 6A
FIG. 6B

LIGHT CONTROLLED SILICON ON INSULATOR DEVICE

BACKGROUND OF THE INVENTION

1. Field of the Invention

The present invention relates to the field of silicon on insulator devices; more specifically, it relates to light controlled silicon on insulator field effect transistors and methods of fabricating said transistors.

2. Background of the Invention

Silicon-on-insulator (SOI) technology is used to fabricate field effect transistors (FETs) with high switching speeds and low power consumption. However, since there is normally no electrical ground on n-type field effect transistor (NFET) bodies nor N-well bias on p-type field effect transistor (PFET) bodies on an SOI wafer, unlike the case of bulk-silicon complimentary metal-oxide-silicon (CMOS), the FET bodies of such devices float to voltages that are a function of the history of the use of circuits containing the FETs. This leaves the possibility of further improvements to trade-offs in standby power and performance. Standby power is adversely affected in that under conditions of high drain voltage the body of a FET is drawn toward the drain voltage, lowering the threshold voltage and, in turn, raising sub-threshold leakage currents. Performance is adversely affected in that under certain circumstances, such as low drain-to-source voltage, the threshold voltage will be high by virtue of near-zero body-to-source bias, leading to low drive. One technique to overcome these problems involves making provision for electrical connection of all of the n-type FET bodies to a first common electrical node and all of the p-type FET bodies to a second common electrical node. When low standby power is required, both common nodes are biased so as to raise the threshold voltages of the FETs (typically negative bias for the n-type FET bodies and positive bias for the p-type FET bodies). When high performance is required, the common nodes are biased so as to lower the threshold voltages of the FETs. Other methods such as, the Multiple-Threshold CMOS (MTCMOS), may involve the use of a virtual power supply and/or ground rail in which MOSFETs with high threshold voltages are used to supply power to virtual power rails, and low-threshold MOSFETs comprise high-speed circuits which are powered by the virtual power rails. Thus the logic circuits can switch rapidly when powered, but can not be effectively cut-off from any standby power drain by switching off the high-threshold FETs that supply power to the virtual rails. These techniques can be applied only to situations where activity of the high-speed circuits can be accurately predicted. Management of the trade-off between high-speed circuits and low standby power requires knowledge of timing and use requirements of the circuits. Furthermore, both techniques require the addition of extensive wiring due to either having to wire the FET bodies, or due to the need for the switched-rail power supply wires as well as signal wires to the high-threshold-voltage FETs which switch these rails.

BRIEF SUMMARY OF THE INVENTION

A first aspect of the present invention is a system comprising a semiconductor die including a substrate having upper and lower surfaces, the semiconductor die including an FET, the FET having a gate on the upper surface, a body under the gate and a source contacting the body forming a body-to-source junction; and a light source, the light source for exposing the body to light from the lower surface.

A second aspect of the present invention is an electronic device adapted for control by exposure to light of a pre-determined wavelength, comprising: a substrate having upper and lower surfaces; an insulating layer having upper and lower surfaces on the upper surface of the substrate; a plurality of FETs formed on the top surface of the insulating layer, each FET having a gate, a body under the gate and a source contacting the body forming a body-to-source junction; trenches in the substrate, the trenches aligned to the body of at least a portion of the FETs, extending from the lower surface of the substrate to the lower surface of the insulating layer and filled with a light transmitting material; and; an optical guide layer on the lower surface of the substrate and on the filled trenches.

A third aspect of the present invention is an electronic device adapted for control by exposure to light of a pre-determined wavelength, comprising: a thermally conductive substrate having upper and lower surfaces; an insulating layer having upper and lower surfaces on the upper surface of the substrate; a plurality of FETs formed on the top surface of the insulating layer, each FET having a gate, a body under the gate and a source contacting the body forming a body-to-source junction; and trenches in the substrate, the trenches aligned to the body of at least a portion of the FETs, extending from the lower surface of the substrate to the lower surface of the insulating layer and filled with a light transmitting material to form optical guides.

A fourth aspect of the present invention is a method of fabricating an electronic device adapted for control by exposure to light of a pre-determined wavelength, comprising: providing a semiconductor die, comprising: a substrate having upper and lower surfaces; an insulating layer having upper and lower surfaces on the upper surface of the substrate; and a plurality of FETs formed on the top surface of the insulating layer, each FET having a gate, a body under the gate and a source contacting the body forming a body-to-source junction; thinning the substrate; forming trenches in the substrate, the trenches aligned to the body of at least a portion of the FETs and extending from the lower surface of the substrate to the lower surface of the insulating layer; filling the trenches with a light transmitting material; and forming an optical guide layer on top of the substrate and the filled trenches.

A fifth aspect of the present invention is a method of fabricating an electronic device adapted for control by exposure to light of a pre-determined wavelength, comprising: providing a semiconductor die, comprising: a substrate having upper and lower surfaces; an insulating layer having upper and lower surfaces on the upper surface of the substrate; and a plurality of FETs formed on the top surface of the insulating layer, each FET having a gate, a body under the gate and a source contacting the body forming a body-to-source junction; thinning the substrate; forming trenches in the substrate, the trenches aligned to the body of at least a portion of the FETs and extending from the lower surface of the substrate to the lower surface of the insulating layer; filling the trenches with a light transmitting material to form optical guides; removing the substrate to expose portions of the insulating layer; and forming a conductive layer on the exposed portions of the insulating layer.

A sixth aspect of the present invention is an electronic device adapted for control by exposure to light of a pre-determined wavelength, comprising: a semiconductor die comprising: a thermally conductive substrate having upper and lower surfaces; an insulating layer having upper and lower surfaces on the upper surface of the substrate; a plurality of FETs formed on the top surface of the insulating layer, each FET having a gate, a body under the gate and a source contacting the body forming a body-to-source junction; and optical paths formed in the substrate, the optical paths disposed to provide light to the body of at least a portion of the FETs, and extending from the lower surface of the substrate to the lower surface of the insulating layer.

BRIEF DESCRIPTION OF THE SEVERAL VIEWS OF THE DRAWINGS

The features of the invention are set forth in the appended claims. The invention itself, however, will be best understood by reference to the following detailed description of an illustrative embodiment when read in conjunction with the accompanying drawings, wherein:

FIG. 6A shows a partial cross section view illustrating a system using the light controlled device according to the present invention; and FIG. 6B shows a top view through 6B—6B of FIG. 6A according to the present invention.

DETAILED DESCRIPTION OF THE INVENTION

Figure 1:
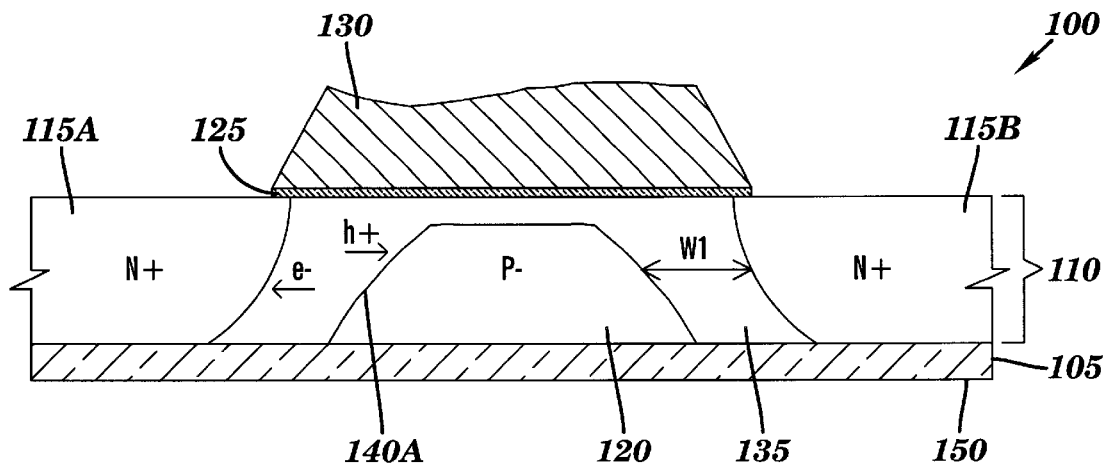
FIG. 1 shows a partial cross-section view through an FET illustrating formation of a space charge region in the semiconductor portion of the FET.

Referring to the drawings, FIG. 1 shows a partial cross-section view through an FET illustrating formation of a space charge region in the semiconductor portion of the FET. The section is taken along the width of the FET as opposed to its length, which is the case for all sectional views in this disclosure. For illustrative purposes, FET 100 is an NFET device fabricated in SOI technology, though the discussion is equally applicable to SOI PFET devices. FET 100 includes an SOI insulator layer 105, a silicon layer 110 over the SOI insulator layer, highly N type doped source/drain regions 115A and 115B and a lightly P doped body region 120 formed in the silicon layer. Where the concentration of N type dopant is equal to the concentration of P type dopant defines body-to-source and body-to-drain junctions. In one example, source/drain regions 115A and 115B are doped with arsenic or phosphorous to a concentration of about 5×1019 to 5×1020 atm/cm3 and body region 120 is doped with boron to a concentration of about 8×1017 to 8×1018 atm/cm3. FET 100 further includes a gate insulator layer 125 over body region 120 and portions of source drain regions 115A and 115B and a gate 130 formed on top of the gate oxide layer. Gate oxide layer 125 electrically isolates gate 130 from body region 120 and source/drain regions 115A and 115B.

Without any external stimulation a space charge region 135 extends from source/drain regions 115A and 115B into body region 120 an average distance "W1". The actual distance is illustrated by surface 140A. Space charge region 135 forms by the attraction of electrons to and repulsion of holes from source/drain region 115A and 115B and is essentially a carrier free region.

Figure 2:
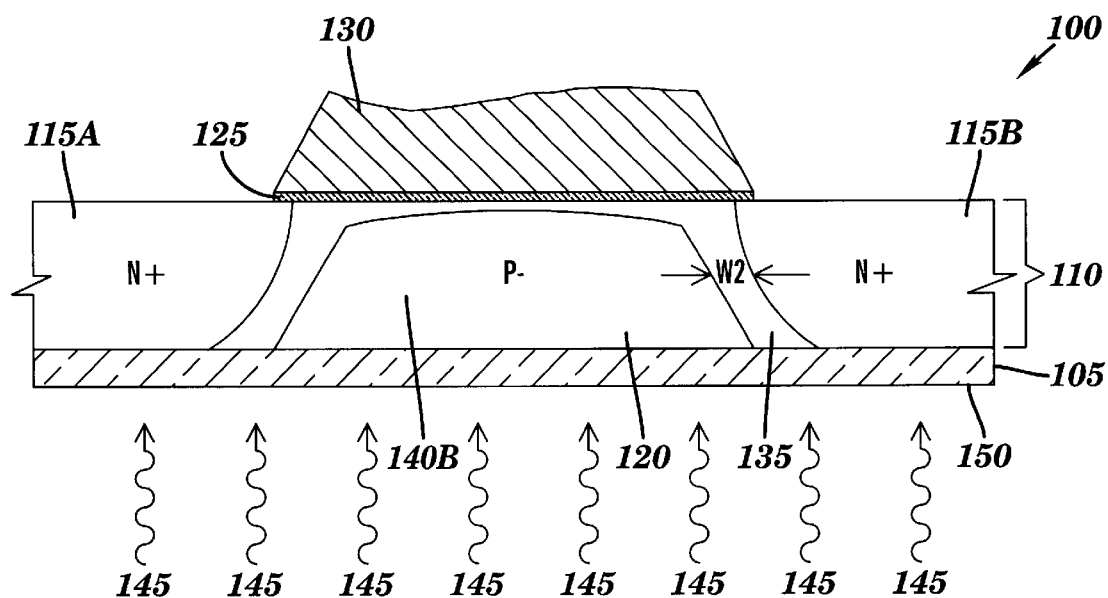
FIG. 2 shows a partial cross-section view through the FET of FIG. 1 illustrating the effect of exposure to light of the semiconductor portion of the FET on the space charge region according to the present invention.

FIG. 2 shows a partial cross-section view through the FET of FIG. 2 illustrating the effect of exposure to light of the semiconductor portion of the FET on the space charge region according to the present invention. Light energy 145 striking a bottom surface 150 of SOI insulator layer 105 penetrates into silicon layer 110 and causes an increase in the rate of electron-hole pair generation. The increase in electron-hole pair generation results in a reduction of the average distance space charge region 135 extends from source/drain regions 115A and 115B into body region 120 from "W1" in FIG. 1 to "W2" in FIG. 2. The actual distance is illustrated by surface 140B.

A reduction in the width of space charge region 135 results in a reduction in VBI (built in voltage) of FET 100. A reduction in VBI of FET 100 results in a lower VT (threshold voltage) for FET 100. For example, when VDS=0 (drain to source voltage), the VT (threshold voltage) of the FET is given by equation 1, $$VT = \Phi ms + (Tox/\varepsilon \mu ox)(\varepsilon \mu Sl q NA \times (2\Phi BI - VBODY))^{1/2} \qquad (1)$$

wherein:

Φms is the fermi level of the gate 130 relative to that of the inversion layer, when formed;

εμox is the permittivity of gate oxide 125;

Tox is the thickness of the gate oxide 125;

εμSl is the permittivity of silicon; q is the electron charge;

NA is the doping density of body region 120;

ΦBI is the fermi level of body region 120 relative to that of intrinsic silicon; and VBODY is the voltage applied to body region 120 of the FET 100.

Upon exposure to light of frequency greater than EGAP/h, wherein EGAP is the energy gap of silicon (≈ 1.1 eV) and h is plank's constant, the quantity (2 ΦBI–VBODY)decreases from roughly 0.8 volts with no light to values approaching zero volts, effectively forward biasing body region 120 with respect to source region 115A, as the light becomes very intense due to generation of excess hole-electron pairs in concentrations far in excess of the equilibrium concentration of these carriers. Thus VT can be reduced from a high value in darkness to as low as Φms (≈0.3 volts for N+ polysilicon on an n-type MOSFET) in intense light.

The penetration of light into silicon layer 110 is a function of the wavelength of the light and decreases rapidly as the wavelength decreases. To ensure that most of the light incident upon silicon layer 110 actually creates carriers in the body; the depth of penetration of light into silicon layer 110 should be less than the thickness of the body. This implies a 400 nm wavelength for a 150 nm thick body. The corresponding photon energy is about 3 eV. Assuming each photon creates an electron-hole pair, the optical power required is IB×3 eV, where IB is the bias current on silicon layer 110. Assuming IB=IOFF/10, where IOFF is the sub-threshold current of FET 100 and a die containing about 108 optically controlled devices requires about 3 watts of power.

Figure 3:
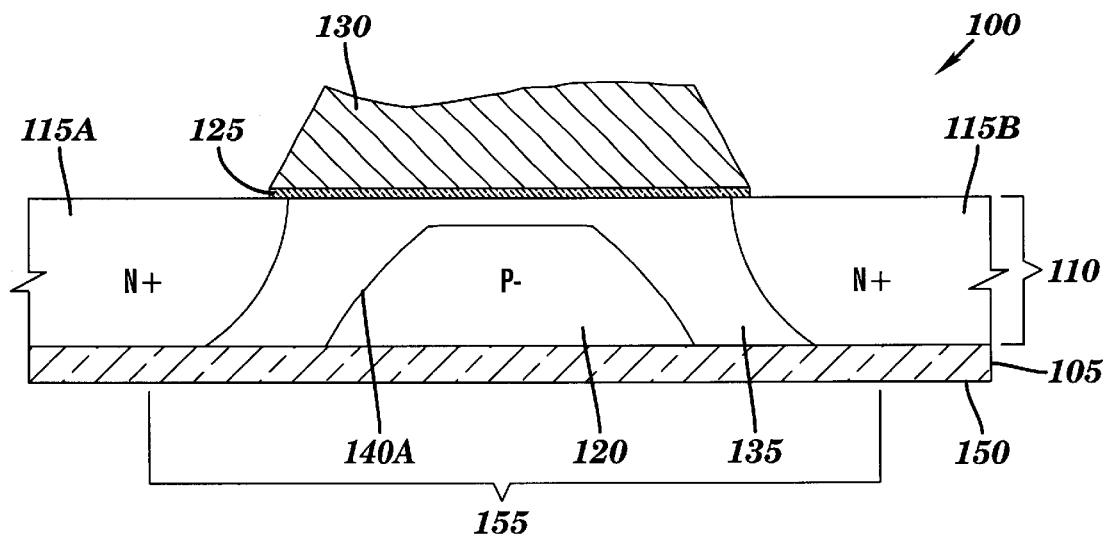
FIG. 3 shows a partial cross-section view through the FET of FIG. 1 illustrating a preferred light exposure region of the semiconductor portion of the FET according to the present invention.

FIG. 3 shows a partial cross-section view through the FET of FIG. 1 illustrating a preferred light exposure region of the semiconductor portion of the FET according to the present invention. It is not necessary to expose all of silicon layer 110 to light, but only that portion of the silicon layer extending from just inside source/drain region 115A across body region 120 to just within source/drain region 115B, which defines an exposure region 155. Exposure well into source/drain regions 115A and 115B does little to change the width of space charge region 135, but does consume more optical power.

Since the exposure of silicon layer 110 is through bottom surface 150 of SOI insulator layer 105, the insulator layer must not be so thick as to absorb the 3 eV photons. In one example, insulator layer 105 is about 50 to 200 nm in thickness.

Figure 4A:
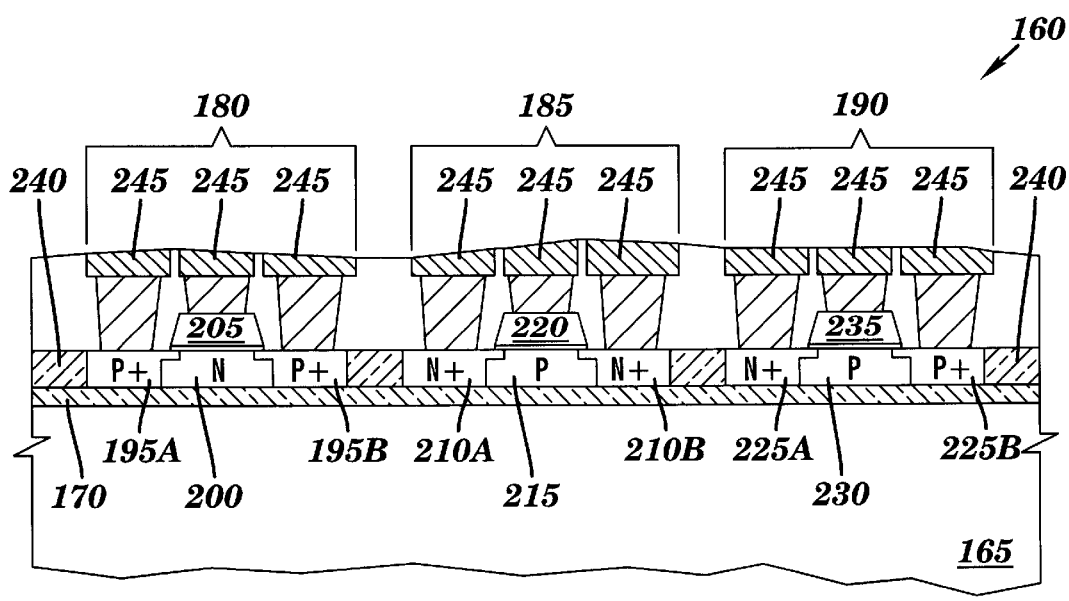
FIGS. 4A through 4G show a sequence of partial cross section views illustrating initial process steps for fabricating a light controlled device according to a first embodiment of the present invention.

Turning to methods of fabricating light controlled FETs, FIGS. 4A through 4G show a sequence of partial cross section views illustrating initial process steps for fabricating a light controlled device according to a first embodiment of the present invention. The method starts with a completed SOI technology wafer 160 as illustrated in FIG. 4A. Formed on silicon substrate 165 is insulator layer 170. Insulator layer 170 is about 50 to 200 nm in thickness. In one example, insulator layer 170 is silicon dioxide. Formed on top on insulator layer 170 are PFET 180, NFET 185 and diode 190. PFET 180 includes P doped source/drain regions 195A and 195B, an N doped body region 200 between the source/drain regions and a gate 205. In one example, source/drain regions 195A and 195B are doped with boron to a concentration of about 5×1019 to 5×1020 atm/cm3 and body region 200 is doped with arsenic or phosphorous to a concentration of about 8×1017 to 8×1018 atm/cm3 and is about 10 to 200 nm in thickness. NFET 185 includes N doped source/drain regions 210A and 210B, a P doped body region 215 between the source/drain regions and a gate 220. In one example, source/drain regions 210A and 210B are doped with arsenic or phosphorous to a concentration of about 5×1019 to 5×1020 atm/cm3 and body region 215 is doped with boron to a concentration of about 8×1017 to 8×1018 atm/cm3. Diode 190 includes an N doped contact region 225A, a P doped contact region 225B, a lightly P doped region 230 between the contact regions and a gate 235. PFET 180, NFET 185 and diode 190 are isolated from one another and other structures on wafer 160 by a trench insulator 240, which is contact with insulator layer 170. In one example, trench insulator 240 is silicon dioxide. Interconnect metallurgy 245 is also illustrated in FIG. 4A.

Figure 4B:
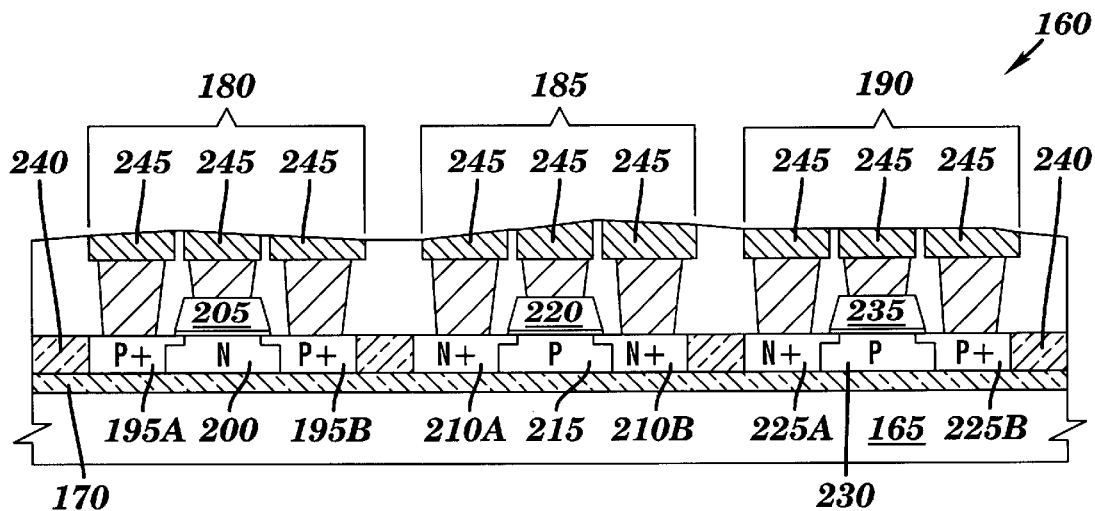

In FIG. 4B, silicon substrate 165 is chemical-mechanical-polished (CMP) to a thickness of about 200 to 500 nm. In one example the CMP process for silicon utilizes a silica slurry.

Figure 4C:
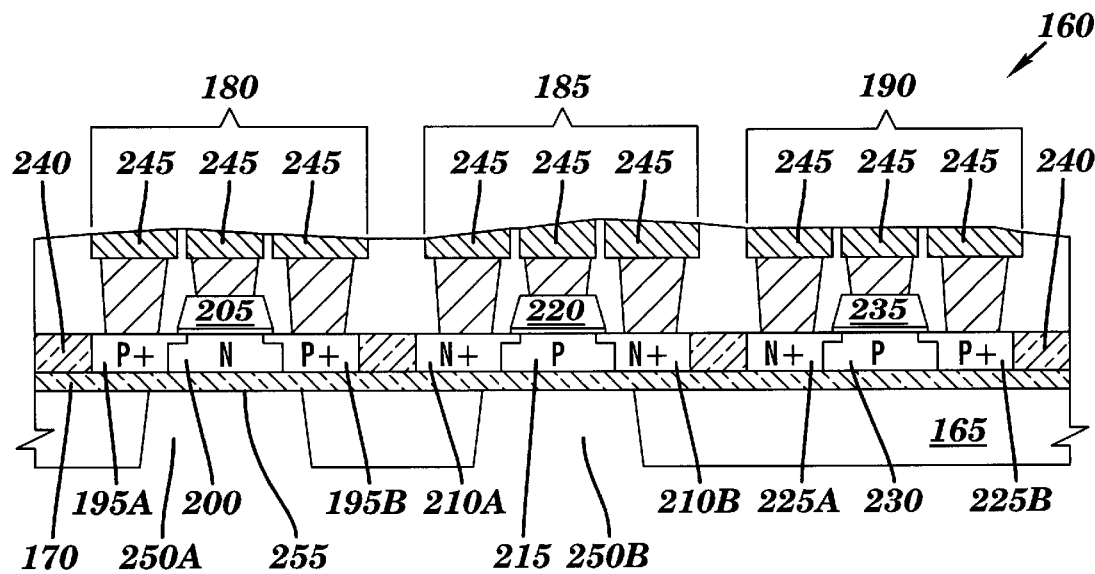

In FIG. 4C, window trenches 250A and 250B are etched under PFET 180 and NFET 185, respectively, to expose lower surface 255 of insulator layer 170. Etching of window trenches 250A and 250B may be accomplished, in one example, by use of a reactive ion etch process selective to silicon over silicon oxide. Window trench 250A aligned to body region 200 but is not as wide as PFET 180 and window trench 185 is aligned to body region 215 but is not as wide as PFET 185. Note silicon substrate 165 is not etched from under diode 190, as light stimulation of the diode would disrupt its proper functioning.

Figure 4D:
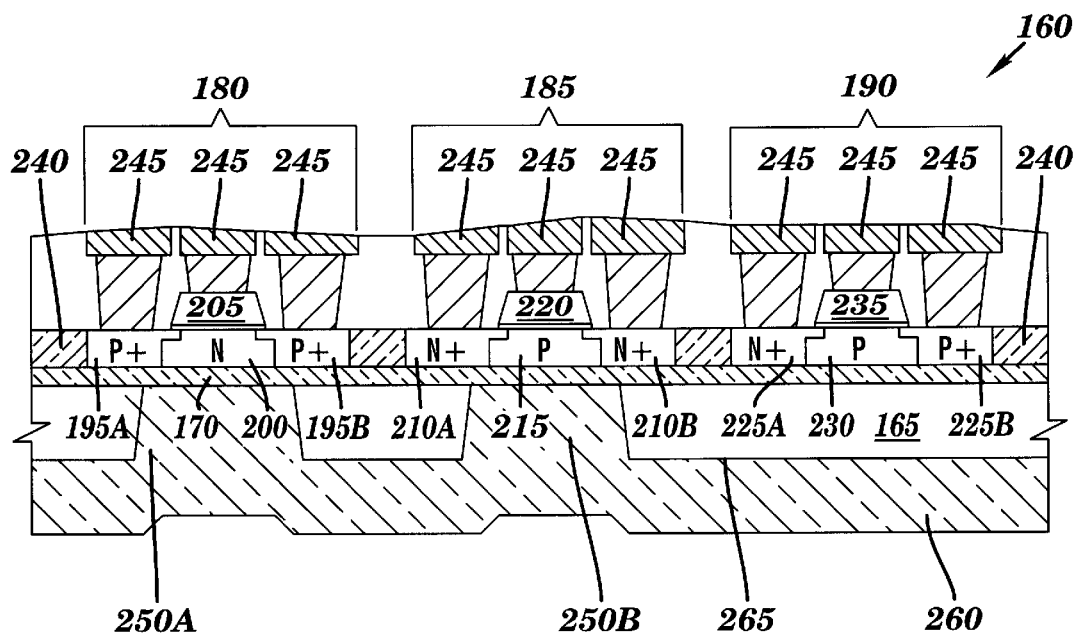

In FIG. 4D, a transparent layer 260 is formed on a bottom surface 265 of silicon substrate 165, which also fills window trenches 250A and 250B. In one example, transparent layer 260 is formed by a chemical-vapor-deposition process (CVD) and is silicon oxide. Transparent layer 260 has a refractive index of about 1.5 to 2.8.

Figure 4E:
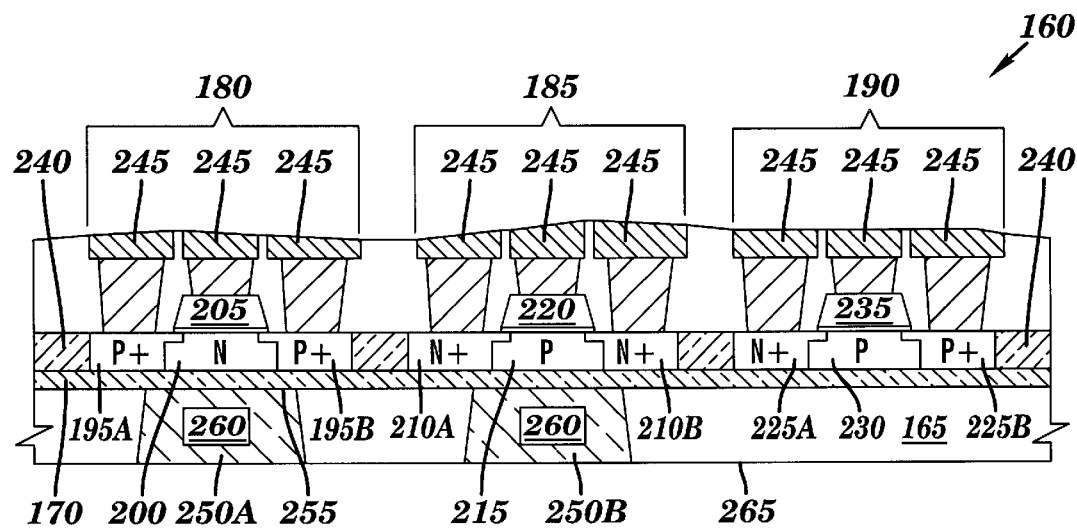

In FIG. 4E, transparent layer 260 is chemical-mechanical-polished co-planer with bottom surface 265 of silicon substrate 165. In one example, the CMP process for silicon dioxide utilizes a silica slurry.

Figure 4F:
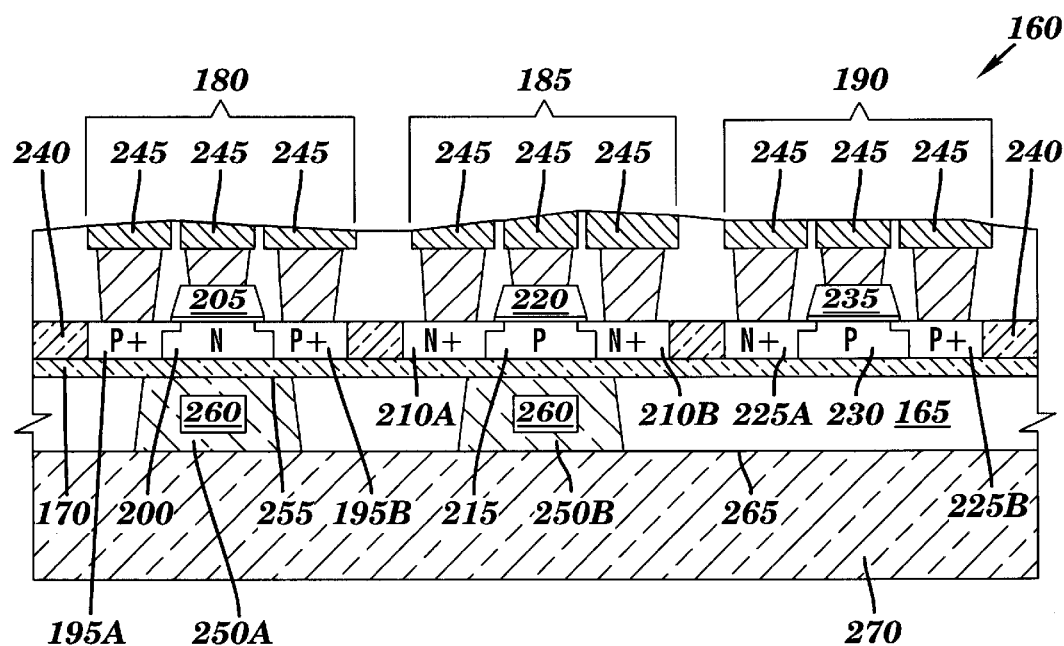

In FIG. 4F, an optical guide layer 270 is formed on bottom surface 265 of silicon substrate 165 and in intimate contact with transparent layer 260 filling window trenches 250A and 250B. In one example, optical guide layer 270 is quartz formed by a sputtering process. Optical guide layer 270 has a refractive index of about 1.5 to 2.8 and is about 20 to 500 nm thick. Since it is the intention to use light of 600 nm or shorter in wavelength to stimulate electron-hole pair generation in the body regions 200 and 215 of PFET 180 and NFET 185 respectively, optical guide layer must be greater than λ>>/2 in order to ensure total internal reflection. Since light of 400 nm wavelength (measured in a vacuum) is 200 nm in quartz λ>>/2 is 100 nm.

Figure 4G:
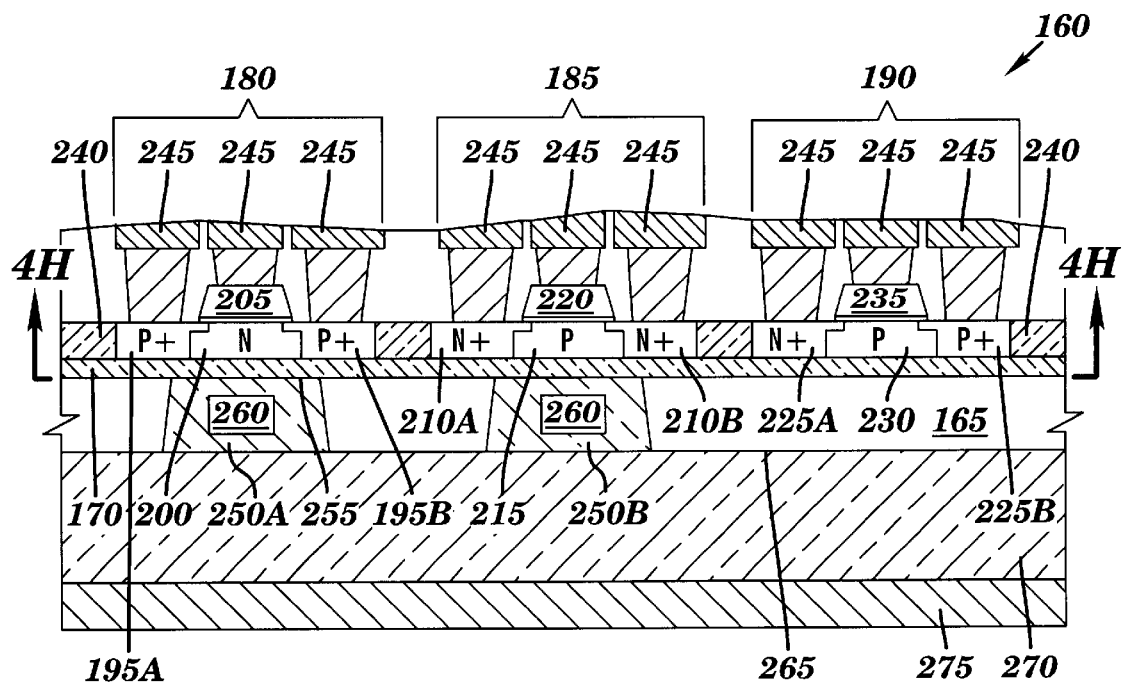

In FIG. 4G, an optional reflective layer 275 is formed on optical guide layer 270. The purpose of reflective layer 275 is to redirect any light that leaves optical guide layer 270 and would otherwise be lost, back into the optical guide layer. Reflective layer 275 may be formed by sputtering, evaporation, or CVD. Reflective layer 275 may be aluminum, titanium, tungsten, platinum, tantalum, nickel, silver or alloys thereof. Reflective layer 275 must be thicker than the skin depth of about 6×10−8 cm for 400 nm light. In one example, reflective layer 275 is about 20 to 500 nm in thickness.

Figure 4H:
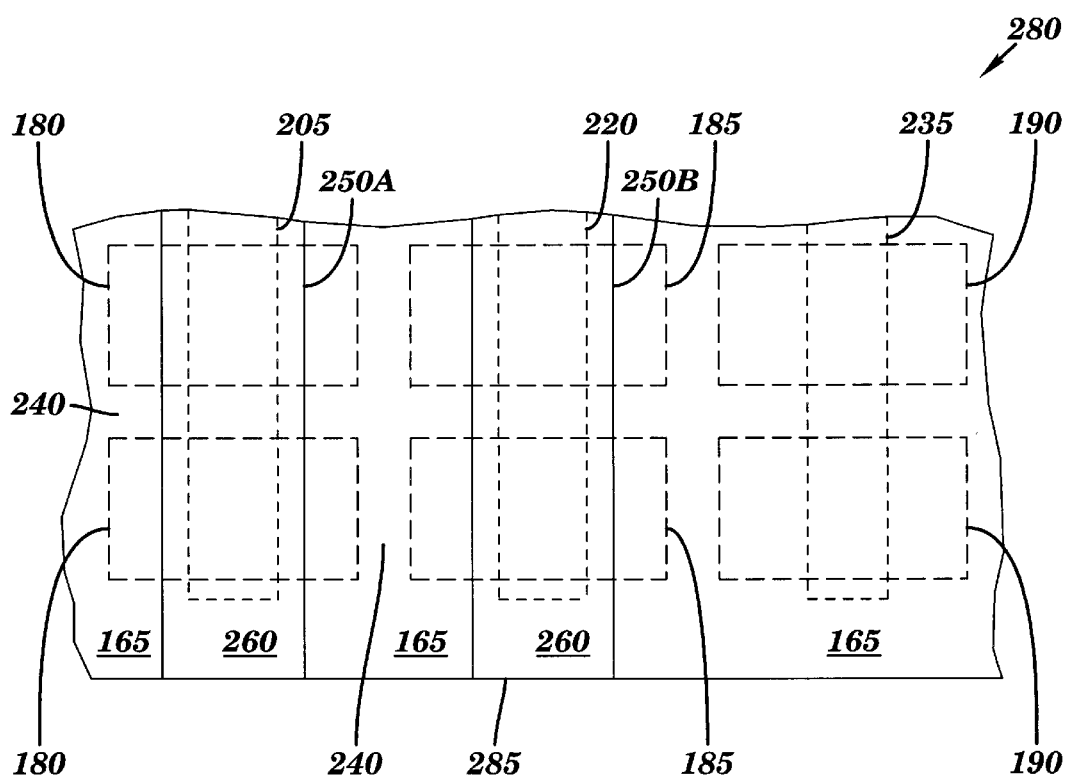
FIG. 4H shows a bottom view through section 4H—4H of FIG. 4G after a dicing operation according to the present invention.

While, for clarity, only three devices are illustrated in FIGS. 4A through 4G, it should be understood that more than one of each type of device, PFET, NFET and diode may exist on wafer 160 as illustrated in FIG. 4H and described below. Additionally window trenches need not be opened under all PFET or under all NFET devices. Therefore, two distinct sets of PFETs may exist, those that are optically controlled, and those that are not. Similarly, two distinct sets of NFETs may exist, those that are optically controlled, and those that are not. The operations that follow are performed after wafer 160 has been diced.

Figure 4I:
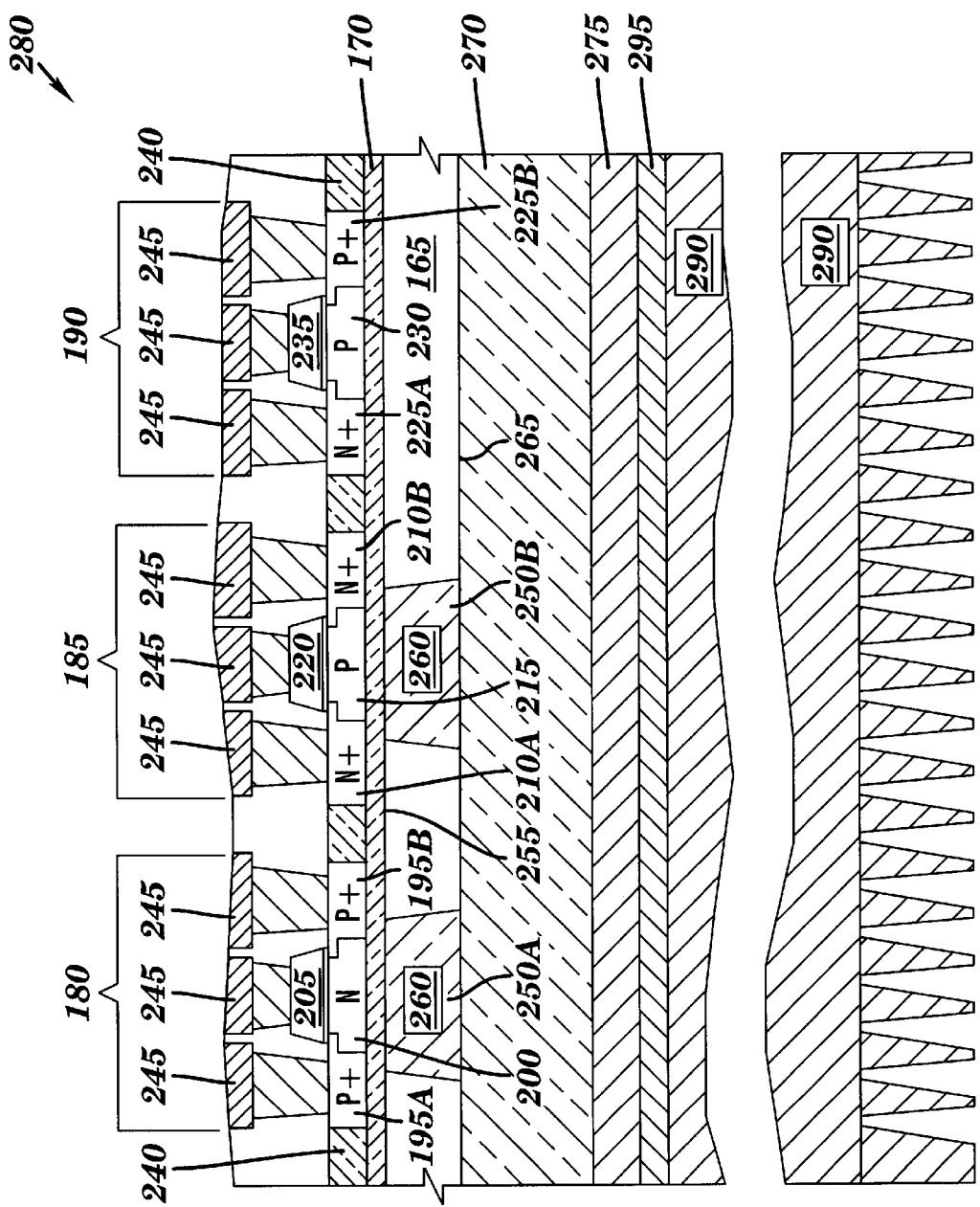
FIG. 4I shows a partial cross section view illustrating additional process steps for fabricating a light controlled device according to the first embodiment of the present invention.

FIG. 4H shows a bottom view through section 4H—4H of FIG. 4G after a dicing operation according to the present invention. In FIG. 4I, wafer 160 has been diced into individual die 280. PFETs 180, NFETs 185, and diodes 190 are isolated from one another by trench insulator 240. Window trenches 250A and 250B extend directly out to polished side 285 of die 280. Edge 285 is polished to provide and optical surface for distribution of light into die 280. Optical guide layer 270, in combination with filled trenches 250A and 250B provide a optical light path from the periphery of die 160 to each body 200 and 215.

Optionally, window trenches 250A and 250B intersect and are integrally formed with an edge trench, also filled with transparent layer 260, running parallel to and extending to polished side 285. FIG. 5J illustrates this option. Additionally, there may be more than one polished side 285, each integrally connected to the same or a different set of window trenches 250A and 250B. This allows for different groups of NFETs, PFETs or NFET/PFET sets to be controlled independently, by optically coupling a different, independently fired, light source to each polished side 285. Similarly, more than one light source may be optically coupled to different window trench sets on the same polished side 285, allowing different groups of NFETs, PFETs or NFET/PFET sets to be controlled independently.

FIG. 4I shows a partial cross section view illustrating additional process steps for fabricating a light controlled device according to the first embodiment of the present invention. In FIG. 4I, optional heat sink 290 has been attached to reflective layer 275 with optional intermediate layer 295. The purpose of heat sink 290 is to increase the rate of heat transfer from die 280 to the surrounding environment. Heat sink 290 may be fabricated from aluminum or copper. Intermediate layer 295 may be conductive (metal filled) paste or conductive (metal filled) epoxy.

Figure 5A:
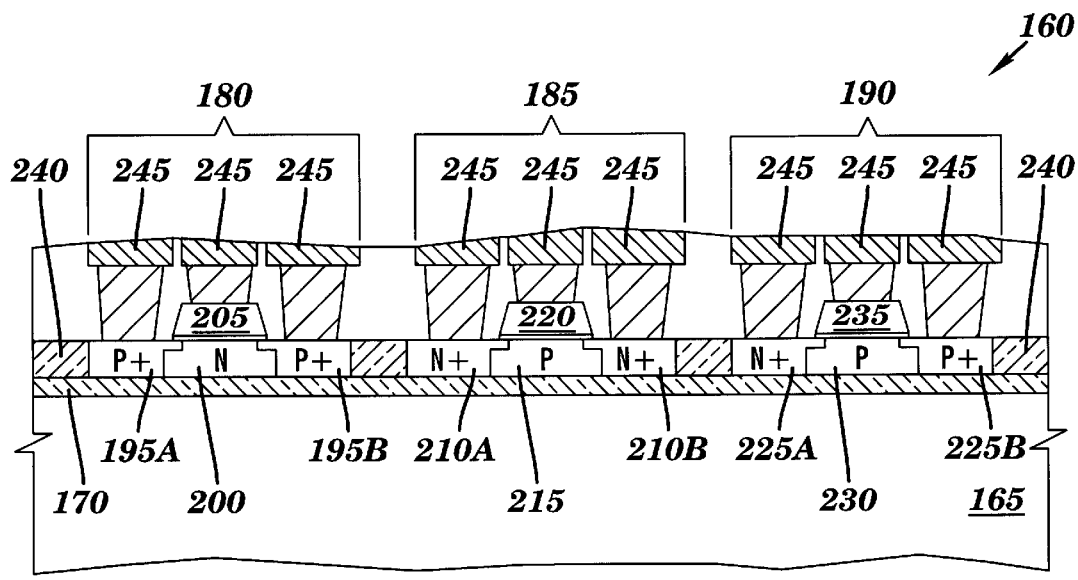
FIGS. 5A through 5I show a sequence of partial cross section views illustrating initial process steps for fabricating a light controlled device according to a second embodiment of the present invention.

FIGS. 5A through 5I show a sequence of partial cross section views illustrating initial process steps for fabricating a light controlled device according to a second embodiment of the present invention. The method starts with a completed SOI technology wafer 160 as illustrated in FIG. 5A. Formed on silicon substrate 165 is insulator layer 170. Insulator layer 170 is about 50 to 200 nm in thickness. In one example, insulator layer 170 is silicon dioxide. Formed on top on insulator layer 170 are PFET 180, NFET 185 and diode 190. PFET 180 includes P doped source/drain regions 195A and 195B, an N doped body region 200 between the source/drain regions and a gate 205. In one example, source/drain regions 195A and 195B are doped with boron to a concentration of about 5×1019 to 5×1020 atm/cm3 and body region 200 is doped with arsenic or phosphorous to a concentration of about 8×1017 to 8×1018 atm/cm3 and is about 10 to 200 nm in thickness. NFET 185 includes N doped source/drain regions 210A and 210B, a P doped body region 215 between the source/drain regions and a gate 235. In one example, source/drain regions 210A and 210B are doped with arsenic or phosphorous to a concentration of about 5×1019 to 5×1020 atm/cm3 and body region 215 is doped with boron to a concentration of about 8×1017 to 8×1018 atm/cm3. Diode 190 includes an N doped contact region 225A, a P doped contact region 225B, a lightly P doped region 230 between the contact regions and a gate 235. PFET 180, NFET 185 and diode 190 are isolated from one another and other structures on wafer 160 by a trench insulator 240, which is contact with insulator layer 170. In one example, trench insulator 240 is silicon dioxide. Interconnect metallurgy 245 is also illustrated in FIG. 5A.

Figure 5B:
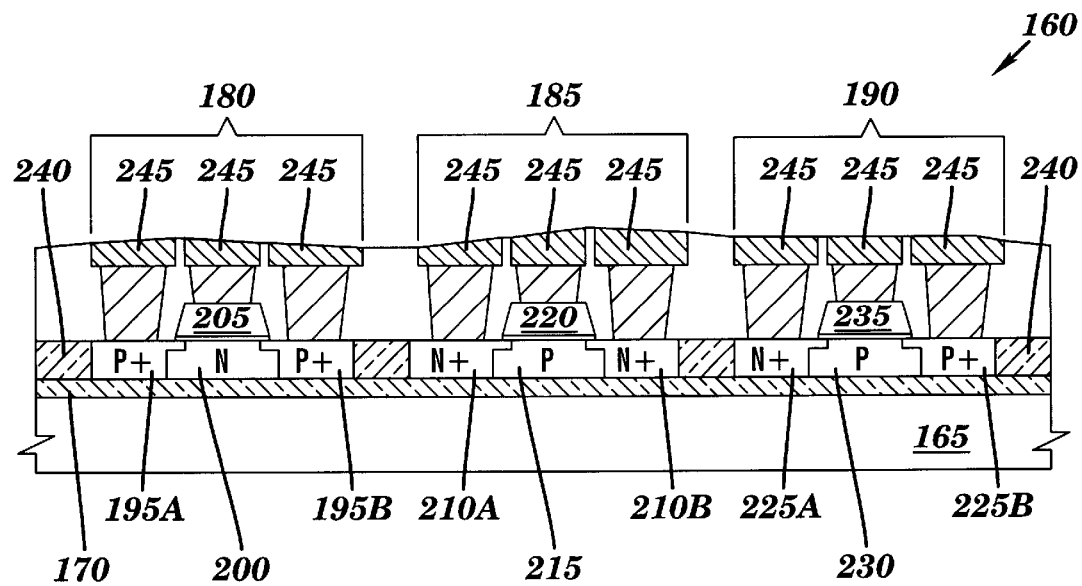

In FIG. 5B, silicon substrate 165 is chemical-mechanical-polished (CMP) to a thickness of about 200 nm to 5000 nm. In one example the CMP process for silicon utilizes a silica slurry.

Figure 5C:
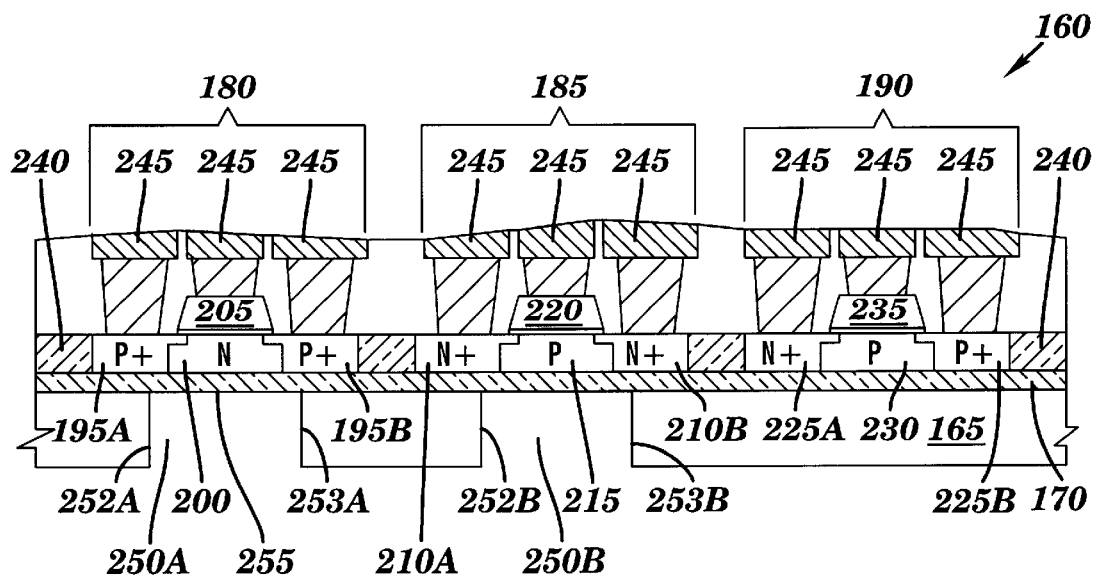

In FIG. 5C, window trenches 250A and 250B are etched under PFET 180 and NFET 185, respectively, to expose lower surface 255 of insulator layer 170. Etching of window trenches 250A and 250B may be accomplished, in one example, by use of a RIE using fluorocarbon-based gases, which process is selective to silicon over silicon oxide. It is desirable that sidewalls 252A and 253A of window trench 250A and sidewalls 252B and 253B of window trench 250B be nearly perpendicular to lower surface 255 of insulator layer 170 for subsequent processing. Window trench 250A aligned to body region 200 but is not as wide as PFET 180 and window trench 185 is aligned to body region 215 but is not as wide as NFET 185. Note silicon substrate 165 is not etched from under diode 190.

Figure 5D:
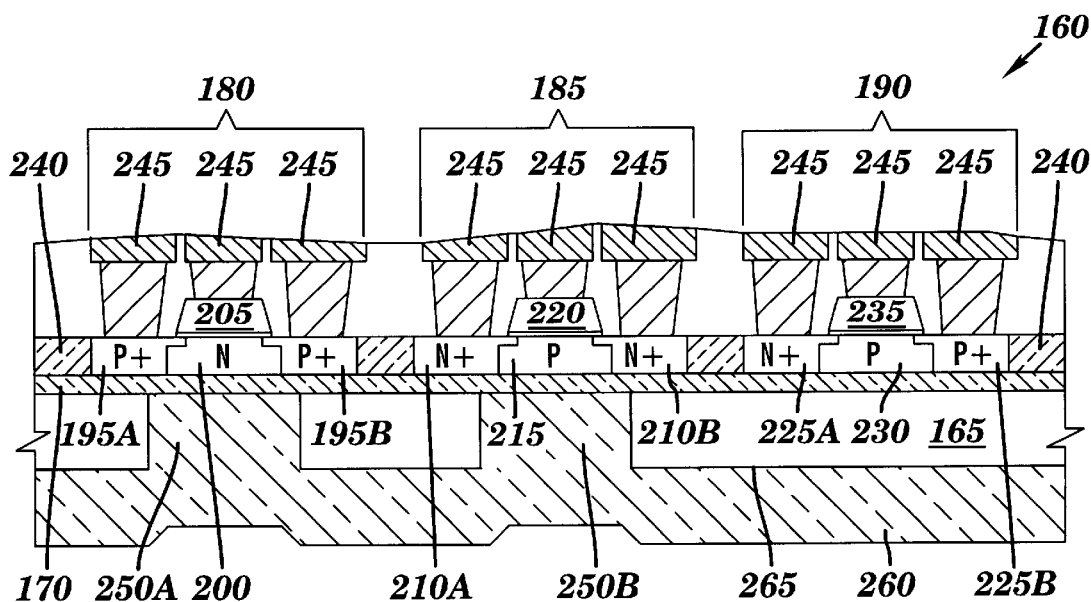

In FIG. 5D, an optical guide layer 270 is formed on a bottom surface 265 of silicon substrate 165, which also fills window trenches 250A and 250B. In one example, optical guide layer 270 is quartz formed by a sputtering process. Optical guide layer 270 has a refractive index of about 1.5 to 2.8.

Figure 5E:
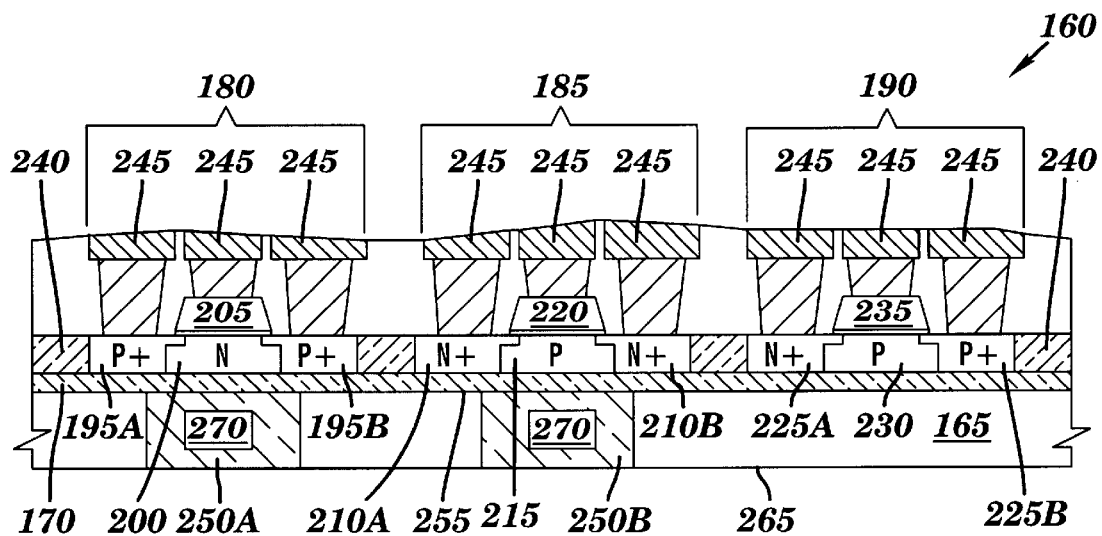

In FIG. 5E, optical guide layer 270 is chemical-mechanical-polished co-planer with bottom surface 265 of silicon substrate 165. In one example the CMP process for quartz utilizes a ceria slurry.

Figure 5F:
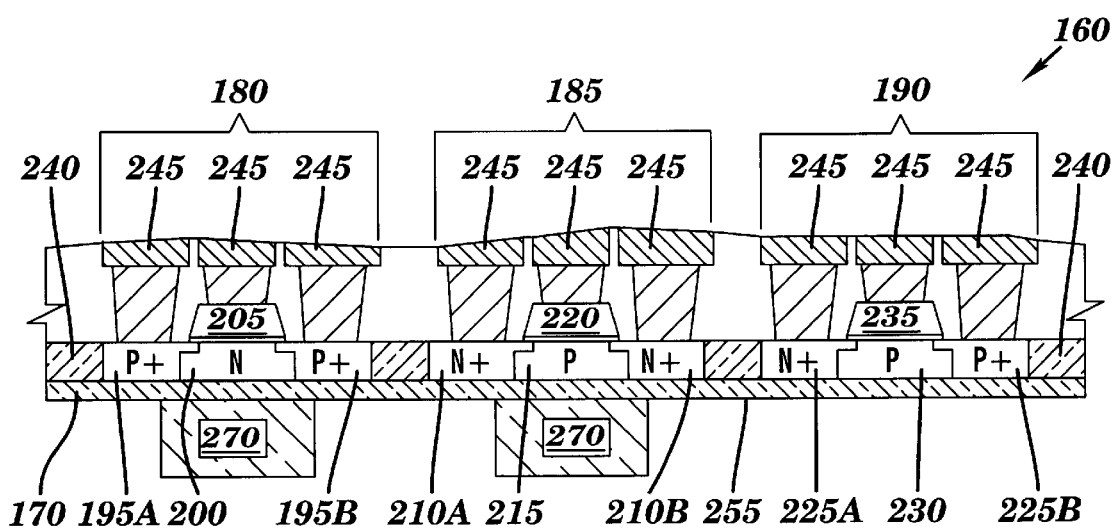

In FIG. 5F, the remaining areas of silicon substrate 165 are removed by etching in a strong base such as aqueous or alcoholic potassium hydroxide in a concentration of about six molar at a temperature of about 20 to 100° C.

Figure 5G:
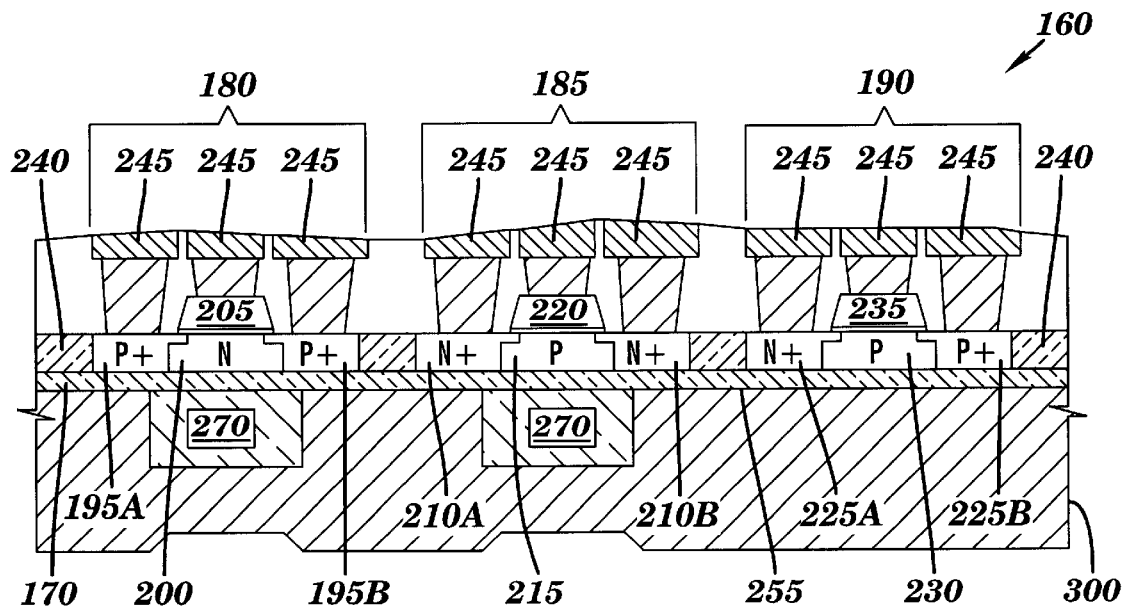
Figure 5H:
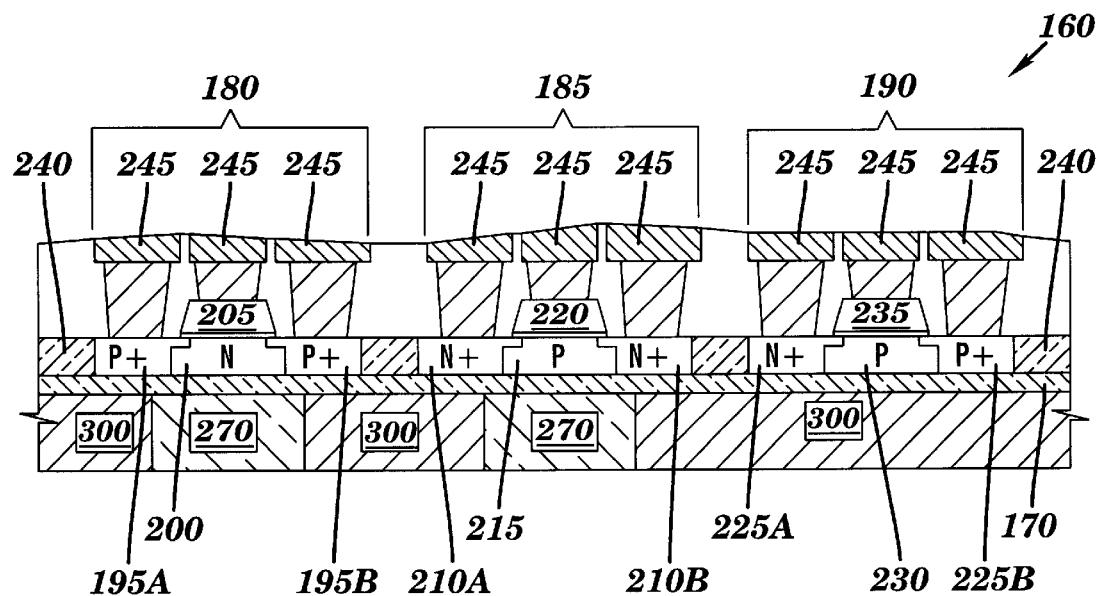

In FIG. 5G, a diamond layer 300 has been formed on bottom surface 255 of insulator 170. In one example, diamond layer 300 is formed by a CVD process. In FIG. 5H, diamond layer 300 and optical guide layer 270 are chemical-mechanical-polished to a thickness of about 20 to 500 nm, with a nominal thickness of 200 nm. In one example, CMP process for diamond utilizes a ceria slurry. Since it is the intention to use light of 400 nm in wavelength to stimulate electron-hole pair generation in the body regions 200 and 215 of PFET 180 and NFET 185 respectively, optical guide layer must be greater than λ>>/2 in order to ensure total internal reflection. Since light of 400 nm wavelength (measured in a vacuum) is 200 nm in quartz λ>>/2 is 100 nm. Alternatively, silicon layer 165 may be polished to a thickness consistent with total internal reflection (greater than λ>>/2) during the polishing process illustrated in FIG. 5B and described above. In this case, diamond layer 300 need only be polished co-planer with optical guide layer 270.

Figure 5I:
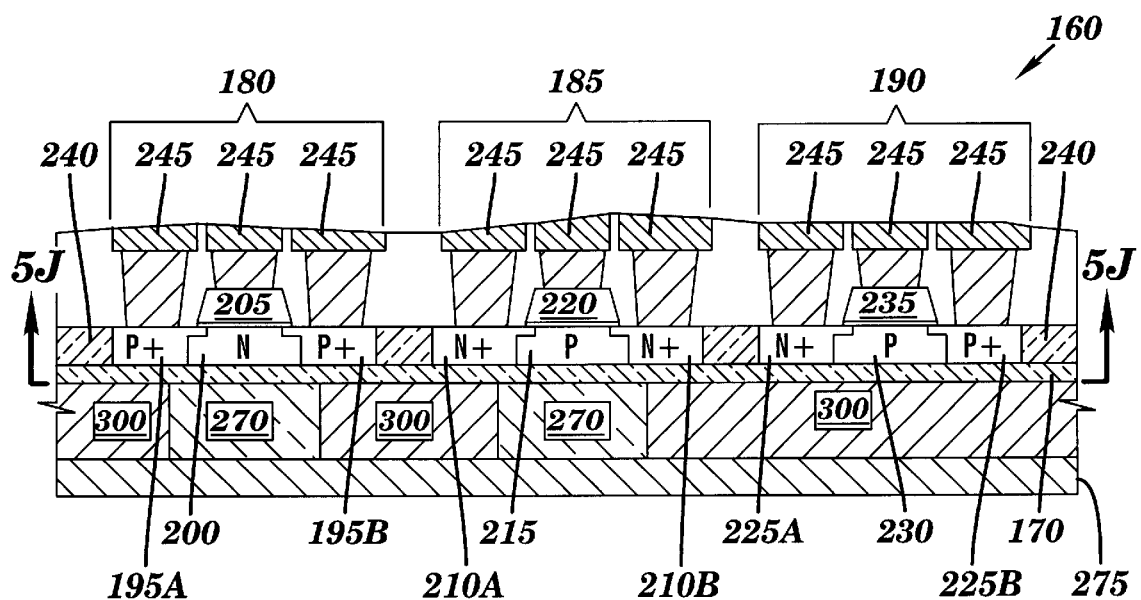
Figure 5J:
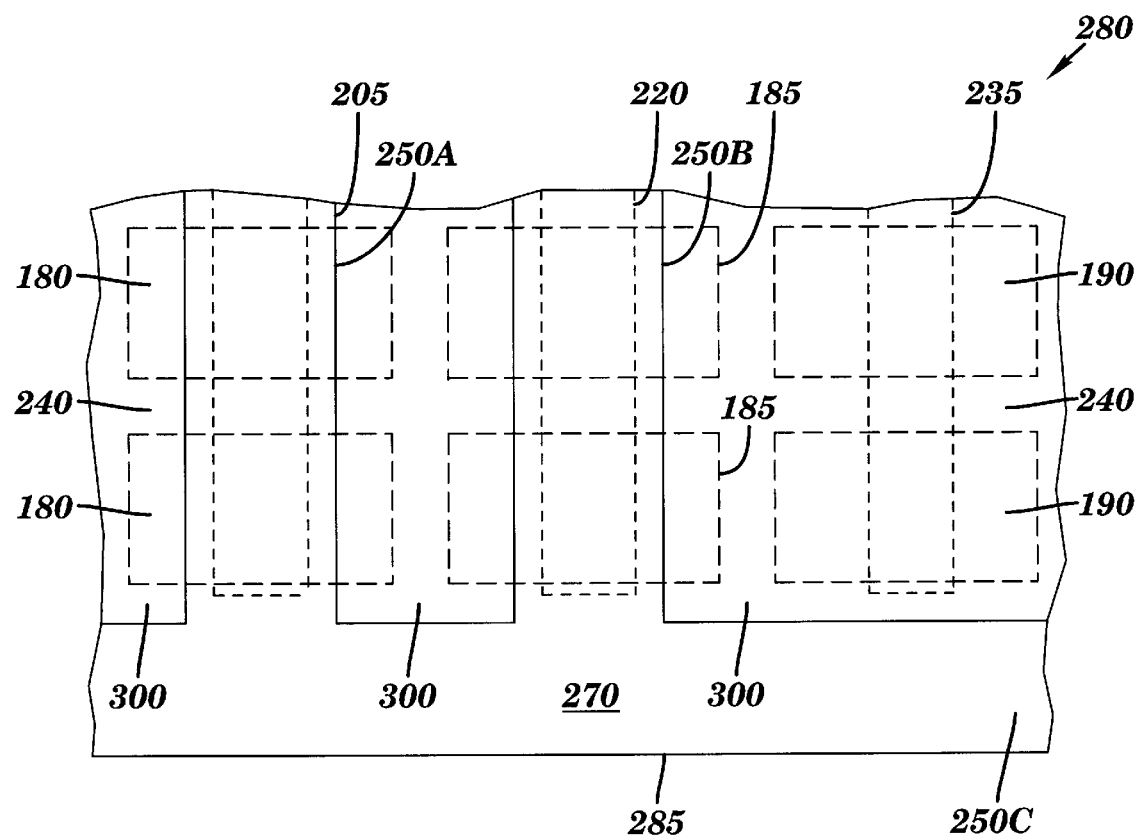
FIG. 5J shows a bottom view through 5J—5J of FIG. 5I after a dicing operation according to the present invention.

In FIG. 5I, an optional reflective layer 275 is formed on optical guide layer 270. The purpose of reflective layer 275 is to redirect any light that leaves optical guide layer 270 and would otherwise be lost, back into the optical guide layer. Reflective layer 275 may be formed by sputtering, evaporation, or CVD. Reflective layer 275 may be aluminum, titanium, tungsten, platinum, tantalum, nickel, silver or alloys thereof. Reflective layer 275 must be thicker than the skin depth of about 6×10−8 for 400 nm light. In one example, reflective layer 275 is about 30 to 300 nm.

While, for clarity, only three devices are illustrated in FIGS. 5A through 5I, it should be understood that more than one of each type of device, PFET, NFET and diode may exist on wafer 160 as illustrated in FIG. 5J and described below. Additionally window trenches need not be opened under all PFET or under all NFET devices. Therefore, two distinct sets of PFETs may exist, those that are optically controlled, and those that are not. Similarly, two distinct sets of NFETs may exist, those that are optically controlled, and those that are not. The operations that follow are performed after wafer 160 has been diced.

FIG. 5J shows a bottom view through section 5J—SJ of FIG. 5I after a dicing operation according to the present invention. In FIG. 5J, wafer 160 has been diced into individual die 280. PFETs 180, NFETs 185, and diodes 190 are isolated from one another by trench insulator 240. Edge 285 is polished to provide and optical surface for distribution of light into die 280. Window trenches 250A and 250B intersect and are integrally formed with edge trench 250C, also filled with transparent layer 260, running parallel to and extending to polished side 285. Optical guide layer 270 provides a optical light path from the periphery of die 160 to each body 200 and 215.

Optionally, window trenches 250A and 250B, may extend out to polished side 285 of die 280. FIG. 4H illustrates this option. Additionally, there may be more than one polished side 285, each integrally connected to the same or a different set of window trenches 250A and 250B. This allows for different groups of NFETs, PFETs or NFET/PFET sets to be controlled independently, by optically coupling a different, independently fired, light source to each polished side 285. Similarly, more than one light source may be optically coupled to different window trench sets on the same polished side 285, allowing different groups of NFETs, PFETs or NFET/PFET sets to be controlled independently.

Figure 5K:
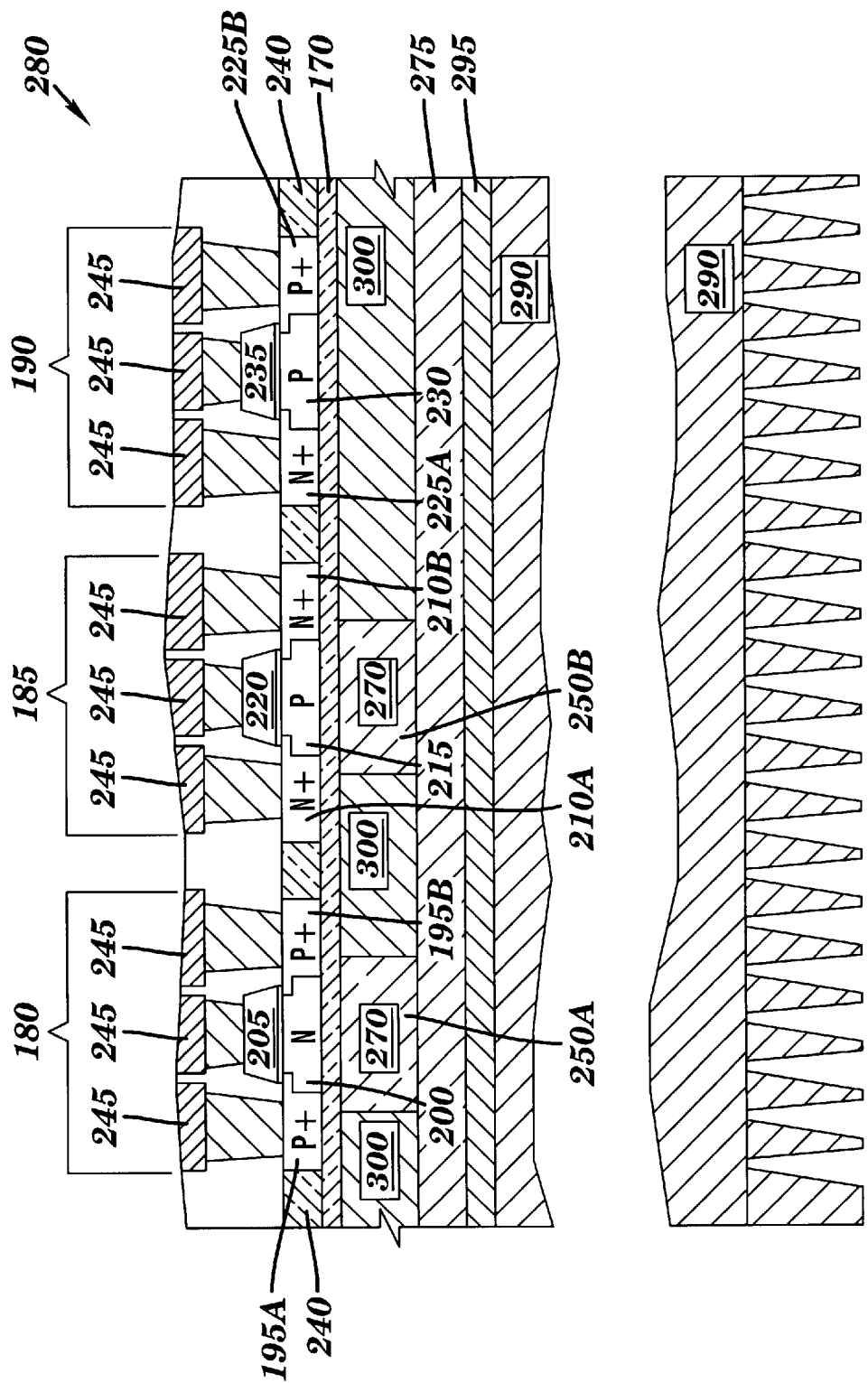
FIG. 5K shows a partial cross section view illustrating additional process steps for fabricating a light controlled device according to the second embodiment of the present invention.

FIG. 5K shows a partial cross section view illustrating additional process steps for fabricating a light controlled device according to the first embodiment of the present invention. In FIG. 5K, optional heat sink 290 has been attached to reflective layer 275 with optional intermediate layer 295. Alternatively, heat sink 290 may be attached to diamond layer 300 using intermediate layer 295. The purpose of heat sink 290 is to increase the rate of heat transfer from die 280 to the surrounding environment. Heat sink 290 may be fabricated from aluminum or copper. Intermediate layer 295 may be conductive (metal filled) paste or conductive (metal filled) epoxy.

Turning to methods of directing light into die 280, FIG. 6A shows a partial cross section view illustrating a system using the light controlled device according to the present invention. Printed circuit board (PCB) 305 includes a substrate 310 and a plurality of pads 315. Electrically connected to PCB 305 through pads 315 is a first optically controlled module 320 containing die 280. Optically coupled to polished side 285 of die 280 is a first spatial filter 325. First spatial filter 325 is optically coupled to a laser module 330 by a first optical fiber cable 335. Laser module 330 produces light pulses with a wavelength of about 20 to 400 nm having a pulse duration of about 10 to 100 picosecond. In operation, laser module 330 is fired whenever it is desired to run die 280, or a portion thereof, in low VT mode. Also shown in FIG. 6A is a second optically controlled module 340 in order to illustrate multiple control source applications. A second spatial filter 345 and a third spatial filter 350 are mounted on first side 355 of second optically controlled module 340. First and second spatial filters 345 and 350 are optically coupled to different sets of NFET and PFETs on the die contained in second optically controlled module 340. Also shown in FIG. 6A are passive devices 360.

FIG. 6B shows a top view through 6B—6B of FIG. 6B according to the present invention. In FIG. 6B, second spatial filter 345 is optically coupled to a second optical fiber cable 365 and third spatial filter 350 is optically coupled to a third optical fiber cable 370. A forth spatial filter 380 is mounted on a second side 380 of second optically controlled module 340. Optically coupled to forth spatial filter 375 is a forth optical cable 385. Second, third and forth optical cables 365, 370 and 385 may be optically couple to one or more additional laser modules (not shown) or each optical cable may be coupled to a different additional laser module (not shown). Alternatively, one or more of second, third and forth optical cables 345, 370 and 385 may be coupled to first laser module 330 in order to synchronize low VT operation of first and second optically controlled modules 320 and 340. Also shown in FIG. 6B are active devices 390 and 395.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. Examples of such modifications, rearrangements and substitutions include the substitution of gallium arsenide or ruby for silicon, fabrication of the invention from bulk wafers as opposed to SOI wafers or elimination or removal of insulating layer 170. Therefore it is intended that the following claims cover all such modifications and changes as fall within the true spirit and scope of the invention.

What is claimed is:

1. An electronic device adapted for control by exposure to light of a pre-determined wavelength, comprising: a substrate having upper and lower surfaces; an insulating layer having upper and lower surfaces on said upper surface of said substrate; a plurality of FETs formed on said top surface of said insulating layer, each FET having a gate, a body under said gate and a source contacting said body forming a body-to-source junction; trenches in said substrate, said trenches aligned to said body of at least a portion of said FETs, extending from said lower surface of said substrate to said lower surface of said insulating layer and filled with a light transmitting material; and; an optical guide layer on said lower surface of said substrate and on said filled trenches.

2. The electronic device according to claim 1, wherein said optical guide layer is quartz.

3. The electronic device according to claim 2, wherein said optical guide layer is at least thicker than half of the equivalent wavelength in quartz of said predetermined wavelength.

4. The electronic device according to claim 1, wherein said optical guide layer has a thickness in the range of 20 nm to 500 nm.

5. The electronic device according to claim 1, wherein said predetermined wavelength is a function of a thickness of said body.

6. The electronic device according to claim 5, wherein the thickness of said body is in the range of 10 to 200 nm.

7. The electronic device according to claim 1, further including a reflective layer on said optical guide layer.

8. The electronic device according to claim 7, wherein said reflective layer is selected from the group consisting of aluminum, titanium, tungsten, platinum, tantalum, nickel, silver and alloys thereof.

9. The electronic device according to claim 7, further including a heatsink attached to said reflective layer.

10. An electronic device adapted for control by exposure to light of a pre-determined wavelength, comprising: a thermally conductive substrate having upper and lower surfaces; an insulating layer having upper and lower surfaces on said upper surface of said substrate; a plurality of FETs formed on said top surface of said insulating layer, each FET having a gate, a body under said gate and a source contacting said body forming a body-to-source junction; and trenches in said substrate, said trenches aligned to said body of at least a portion of said FETs, extending from said lower surface of said substrate to said lower surface of said insulating layer and filled with a light transmitting material to form optical guides.

11. The electronic device according to claim 10, wherein said substrate is diamond.

12. The electronic device according to claim 10, wherein said substrate is at least thicker than half of the equivalent wavelength in said light transmitting material of said predetermined wavelength.

13. The electronic device according to claim 10, wherein said light transmitting material is quartz.

14. The electronic device according to claim 10, wherein said substrate has a thickness in the range of 200 nm to 5000 nm.

15. The electronic device according to claim 10, wherein said predetermined wavelength is a function of a thickness of said body.

16. The electronic device according to claim 15, wherein the thickness of said body is in the range of 10 to 200 nm.

17. The electronic device according to claim 10, further including a reflective layer on said substrate and optical guides.

18. The electronic device according to claim 17, wherein said reflective layer is selected from the group consisting of aluminum, titanium, tungsten, platinum, tantalum, nickel, silver and alloys thereof.

19. The electronic device according to claim 17, further including a heatsink attached to said reflective layer.

20. An electronic device adapted for control by exposure to light of a predetermined wavelength, comprising: a semiconductor die comprising: a heat conductive substrate having upper and lower surfaces; an insulating layer having upper and lower surfaces on said upper surface of said substrate; a plurality of FETs formed on said top surface of said insulating layer, each FET having a gate, a body under said gate and a source contacting said body forming a body-to-source junction; and optical paths formed in said substrate, said optical paths disposed to provide light to said body of at least a portion of said FETs, and extending from said lower surface of said substrate to said lower surface of said insulating layer.

21. The electronic device according to claim 20, wherein said optical paths emerge on one or more sides of said semiconductor die.

22. The electronic device according to claim 21, further comprising one or more lasers optically coupled to each said side of said semiconductor die where said optical paths emerge, said lasers for exposing said bodies to light emitted by said laser.

* * * * *